United States Patent
Shu et al.

(10) Patent No.: US 11,720,725 B2
(45) Date of Patent: Aug. 8, 2023

(54) DIGITAL-TWIN MODELING METHOD FOR AUTOMATED TESTING PIPELINE FOR CIRCUIT BREAKERS

(71) Applicant: Wenzhou University, Zhejiang (CN)

(72) Inventors: Liang Shu, Wenzhou (CN); Dingfang Chen, Wenzhou (CN); Yanfang Yang, Wenzhou (CN); Guichu Wu, Wenzhou (CN); Ziran Wu, Wenzhou (CN); Wei Chen, Wenzhou (CN); Miao Yang, Wenzhou (CN); Jie Zhang, Wenzhou (CN); Xu Zhang, Wenzhou (CN)

(73) Assignee: WENZHOU UNIVERSITY, Zhejiang (CN)

( * ) Notice: Subject to any disclaimer, the term of this patent is extended or adjusted under 35 U.S.C. 154(b) by 404 days.

(21) Appl. No.: 16/992,105

(22) Filed: Aug. 13, 2020

(65) Prior Publication Data

US 2021/0116505 A1    Apr. 22, 2021

(30) Foreign Application Priority Data

Oct. 22, 2019 (CN) .......................... 201911005760.0

(51) Int. Cl.
    *G06F 30/20*     (2020.01)
    *G01R 31/327*     (2006.01)
    (Continued)

(52) U.S. Cl.
    CPC ......... *G06F 30/20* (2020.01); *G01R 31/3277* (2013.01); *G05B 17/00* (2013.01); *G05B 19/41885* (2013.01)

(58) Field of Classification Search
    CPC ... G06F 30/20; G05B 17/00; G05B 19/41885; G01R 31/3277
    See application file for complete search history.

(56) References Cited

U.S. PATENT DOCUMENTS 5,097,589 A * 3/1992 Rezac ................ H01H 71/0221
    29/469
9,418,476 B2 * 8/2016 Georgescu .............. G06F 30/00
(Continued)

OTHER PUBLICATIONS

Klingner, B. "Tetrahedral Mesh Improvement" Thesis, U. California Berkeley (2008) (Year: 2008).*

(Continued)

*Primary Examiner* — Jay Hann
(74) *Attorney, Agent, or Firm* — Leong C. Lei

(57) ABSTRACT

A digital-twin modeling method for an automated testing pipeline for circuit breakers involves acquiring a three-dimensional digitalized model of each mechanical installation in the testing pipeline; modeling hierarchy according to an actual production process and motion states; performing mesh optimization on the resulting model; designing movements of each said mechanical installation, so as to obtain mechanical movement tracks of the models; combining actual movement logic and cooperative relationship among the movements to edit the mechanical movement tracks of the models; and introducing motion control, so as to conduct motion simulation in a digital-twin scene, thereby implementing virtual movements synchronous with movements of the actual testing pipeline. The method realizes centralized management of production data of the pipeline and realizes remote visualized operation, management and maintenance of the testing pipeline, thereby providing a basic platform for digitalized production of miniature circuit breakers.

6 Claims, 8 Drawing Sheets

(51) Int. Cl.
*G05B 19/418* (2006.01)
*G05B 17/00* (2006.01)

(56) References Cited

U.S. PATENT DOCUMENTS

| | | | |
|---|---|---|---|
| 10,249,077 B2* | 4/2019 | Laurent | G06T 15/005 |
| 10,685,430 B2* | 6/2020 | Liu | G06T 17/20 |
| 2020/0101601 A1* | 4/2020 | Zhuo | G05B 19/056 |
| 2022/0026884 A1* | 1/2022 | Quiros Araya | G05B 19/4185 |

OTHER PUBLICATIONS

Kühn, W. "Digital Factory—Simulation Enhancing the Product and Production Engineering Process" Proceedings of 2006 Winter Simulation Conf., pp. 1899-1906 (2006) (Year: 2006).*

Preuveneers, D., et al. "Robust digital twin compositions for Industry 4.0 smart manufacturing systems" IEEE 22nd Int'l Enterprise Distributed Object Computing Workshop, pp. 69-78 (2018) (Year: 2018).*

Klingner, B., et al. "Stellar: A Tetrahedral Mesh Improvement Program" accessed from <https://people.eecs.berkeley.edu/~jrs/stellar/#pubs> (Year: 2022).*

\* cited by examiner

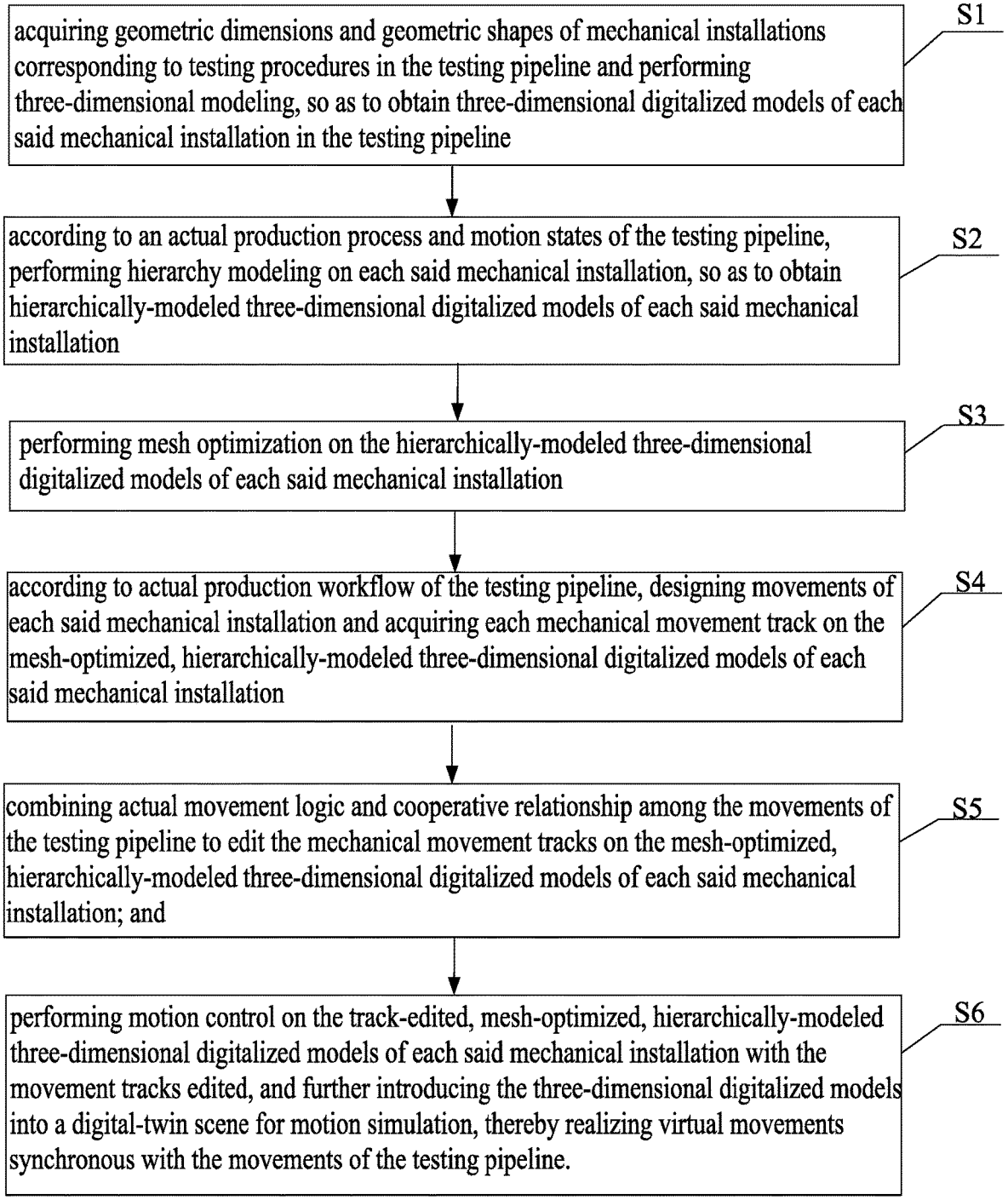
F I G. 1

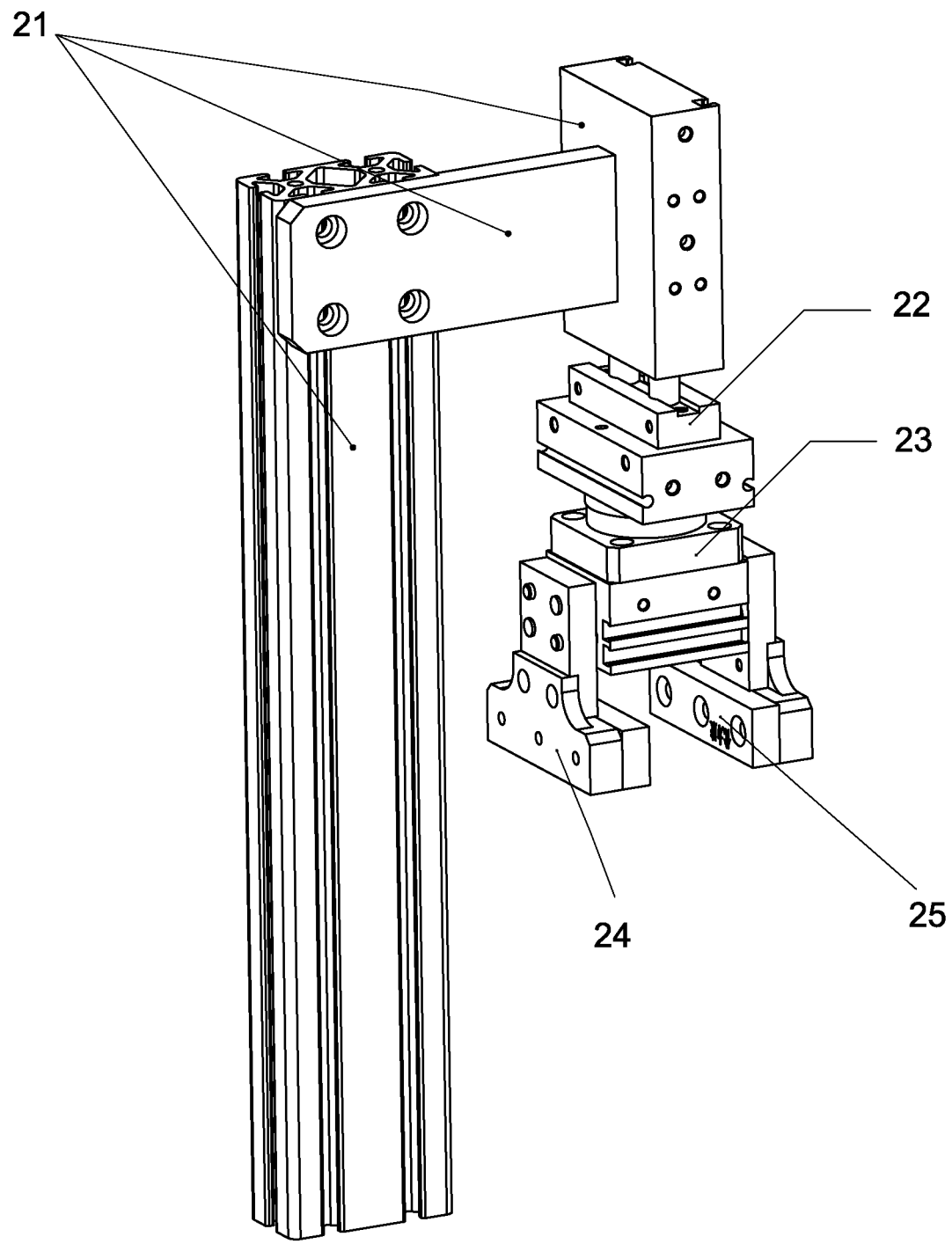
F I G. 2

DIGITAL-TWIN MODELING METHOD FOR AUTOMATED TESTING PIPELINE FOR CIRCUIT BREAKERS

BACKGROUND OF THE INVENTION

1. Technical Field

The present invention relates to testing and digital modeling for pipelines, and more particularly to a digital-twin modeling method for an automated testing pipeline for circuit breakers.

2. Description of Related Art

Circuit breakers are important protective equipment in distribution networks and are extensively used in various fields of national economy, such as power, oil, chemistry, and architecture. Their protection characteristics mainly lie on securing stable operation of the networks, thus being significant to ensure personal and property safety. Therefore, circuit breakers before leaving factories must undergo thorough functional tests and be verified as satisfying various metrics such as product quality and protection characteristics, so as to ensure that they are reliable and accurate in these performance metrics.

Traditionally, manufacturing of miniature circuit breakers is labor intensive because the assembling and testing involve a great deal of manual operations, yet lack for effective information management. After automatized, a testing pipeline has become an important part of breaker manufacturing, and provides on-line check and testing of protection characteristics of the breakers, including verification of overload protection characteristics and short-circuit protection characteristic. The existing automated testing pipelines for circuit breakers usually have a U-shaped structure and includes 12 modules each representing a key procedures in the entire process, including: single-pole nail-piercing, single-pole riveting, laser marking, automatic delay, multi-pole assembly, multi-pole nail-piercing, multi-pole riveting, code scanning, on-off withstand voltage, pad printing, fabricating and sealing.

However, in such an automatized testing pipeline, integration and centralized management of information are impossible because there is no information link within the installations themselves and among different installations. This leads to information islands, which hinders timely information interaction between the management level and the execution level in a workshop and drag updating of operation and management states. As a result, the management of a workshop is blocked from transparent, real-time and dynamic manner monitoring, management and maintenance of the pipeline.

Hence, there is a need for a method of digital-twin modeling designed for automated testing pipelines for miniature circuit breakers, which provides a basic platform for digitalized production of miniature circuit breakers, and uses information fusion and interaction between actual, physical installations of the testing pipeline and the digital-twin models to realize centralized management of production data of the pipeline and to realize remote visualized operation, management and maintenance of the testing pipeline. This is of significance to digitalization of production of traditional low-voltage circuit breakers.

SUMMARY OF THE INVENTION

To address the foregoing technical issues, in one embodiment, the present invention provides a digital-twin modeling method for an automated testing pipeline for circuit breakers, which uses information fusion and interaction between actual, physical installations of the testing pipeline and the digital-twin models to realize centralized management of production data of the pipeline and to realize remote visualized operation, management and maintenance of the testing pipeline, for providing a basic platform for digitalized production of miniature circuit breakers.

In order to address the aforementioned technical issue, the present invention in one embodiment provides a digital-twin modeling method for an automated testing pipeline for circuit breakers. The method comprises the following steps:

Step S1, acquiring geometric dimensions and geometric shapes of mechanical installations corresponding to testing procedures in the testing pipeline and performing three-dimensional modeling, so as to obtain three-dimensional digitalized models of each said mechanical installation in the testing pipeline;

Step S2, according to an actual production process and motion states of the testing pipeline, performing hierarchy modeling on each said mechanical installation, so as to obtain hierarchically-modeled three-dimensional digitalized models of each said mechanical installation;

Step S3, performing mesh optimization on the hierarchically-modeled three-dimensional digitalized models of each said mechanical installation;

Step S4, according to actual production workflow of the testing pipeline, designing movements of each said mechanical installation and acquiring each mechanical movement track on the mesh-optimized, hierarchically-modeled three-dimensional digitalized models of each said mechanical installation;

Step S5, combining actual movement logic and cooperative relationship among the movements of the testing pipeline to edit the mechanical movement tracks on the mesh-optimized, hierarchically-modeled three-dimensional digitalized models of each said mechanical installation; and Step S6, performing motion control on the track-edited, mesh-optimized, hierarchically-modeled three-dimensional digitalized models of each said mechanical installation with the movement tracks edited, and further introducing the three-dimensional digitalized models into a digital-twin scene for motion simulation, thereby realizing virtual movements synchronous with the movements of the testing pipeline.

Therein, the method further comprises:

optimizing rendering of the digital-twin scene using global illumination.

Therein, "performing hierarchy modeling on each said mechanical installation" in Step S2 involves combining the models of the same mechanical installation that have physical connection and have the same movement tracks into a movement level, or associating the lower level models that have physical connection in terms of movement but have different said movement tracks into children of a higher level model through linkage so as to build movement association between the models.

Therein, "performing mesh optimization on the hierarchically-modeled three-dimensional digitalized models of each said mechanical installation" is Step S3 is realized through decreasing vertex numbers and face numbers of polygons included in the hierarchically-modeled three-dimensional digitalized models of each said mechanical installation.

Therein, "according to actual production workflow of the testing pipeline, designing movements of each said mechanical installation and acquiring each mechanical movement track on the mesh-optimized, hierarchically-modeled three-dimensional digitalized models of said mechanical installation" in Step S4 comprises the following steps:

dividing motions of each said mechanical installation in the actual production workflow into a plurality of movement track sections; determining a chronological order of the plural movement track sections of each said mechanical installation;

according to the chronological order of the plural movement track sections of each said mechanical installation, on the mesh-optimized, hierarchically-modeled three-dimensional digitalized models of each said mechanical installation, determining the highest level model of each said movement track section of each said mechanical installation, and recording the initial position and the end position of the highest level model of each said movement track section of each said mechanical installation; and taking the recorded initial and end positions of the highest level model of each said movement track section of each said mechanical installation as key frames, and combining all the recorded key frames of the same mechanical installation according to the chronological order of the corresponding movement track sections, so as to obtain the mechanical movement tracks on the three-dimensional digitalized models of each said mechanical installation.

Therein, "editing the mechanical movement tracks on the three-dimensional digitalized models of each said mechanical installation" in Step S5 comprises:

on the respective mesh-optimized, hierarchically-modeled three-dimensional digitalized models of each said mechanical installation, capturing the movement tracks participating in circuit breaker movement and editing them into to-be-controlled motion clips, used to control the circuit breaker movement through late-stage scripting; and capturing the movement tracks not participating in the circuit breaker movement and editing them into to-be-played motion clips, used to be played during late-stage simulation of the automated testing pipeline, thereby forming a complete and smooth movement process.

Therein, "performing motion control on the track-edited, mesh-optimized, hierarchically-modeled three-dimensional digitalized models of each said mechanical installation with the movement tracks edited" in Step S6 comprises kinetic control of the models, motion control of the mechanical installations, coordinated control between kinetic movement of the models and movement of the mechanical installations, and coordinated motion control among the plural installations, in which the kinetic control of the models is motion control for the circuit breakers in the digital-twin scene, and realizes motion control of the circuit breakers through collision testing;

the motion control of the mechanical installations refers to performing state modeling on each said mechanical installation corresponding to each testing procedure for the circuit breakers, wherein the state modeling is edited according to the motions;

the coordinated control between kinetic movement of the models and movement of the mechanical installations is performed by a trigger, which simulates measurement and positioning for the circuit breakers as achieved using sensors in an actual, physical workshop; and the coordinated motion control among the plural installations is achieved by the plural installations in serial or parallel connection jointly, thereby providing testing of a certain protection characteristic of the circuit breakers.

By implementing the present invention embodiment, the following beneficial effects can be achieved. The present invention uses physically based data of the automated testing pipeline to create three-dimensional models, and conducts motion control according to actual production workflow of the testing pipeline, thereby fully mapping and expressing actual, physical equipment in terms of geometric dimension, appearance, physical property, dynamic property, and movement logic of the models. With information fusion and interaction among actual, physical installations of the testing pipeline, the present invention realizes centralized management of production data of the pipeline, and realizes remote visualized operation, management and maintenance of the testing pipeline, thereby providing a basic platform for digitalized production of miniature circuit breakers.

BRIEF DESCRIPTION OF THE DRAWINGS

The invention as well as a preferred mode of use, further objectives and advantages thereof will be best understood by reference to the following detailed description of illustrative embodiments when read in conjunction with the accompanying drawings, wherein:

FIG. 1 is a flowchart of a digital-twin modeling method for an automated testing pipeline for circuit breakers according tone embodiment of the present invention;

FIG. 2 is a perspective view of a robot arm rotating mechanism in a laser marking unit of an automated testing pipeline for circuit breakers used in the digital-twin modeling method of the present invention, showing it performing hierarchy modeling in Step S2;

DETAILED DESCRIPTION OF THE INVENTION

Figure 3:
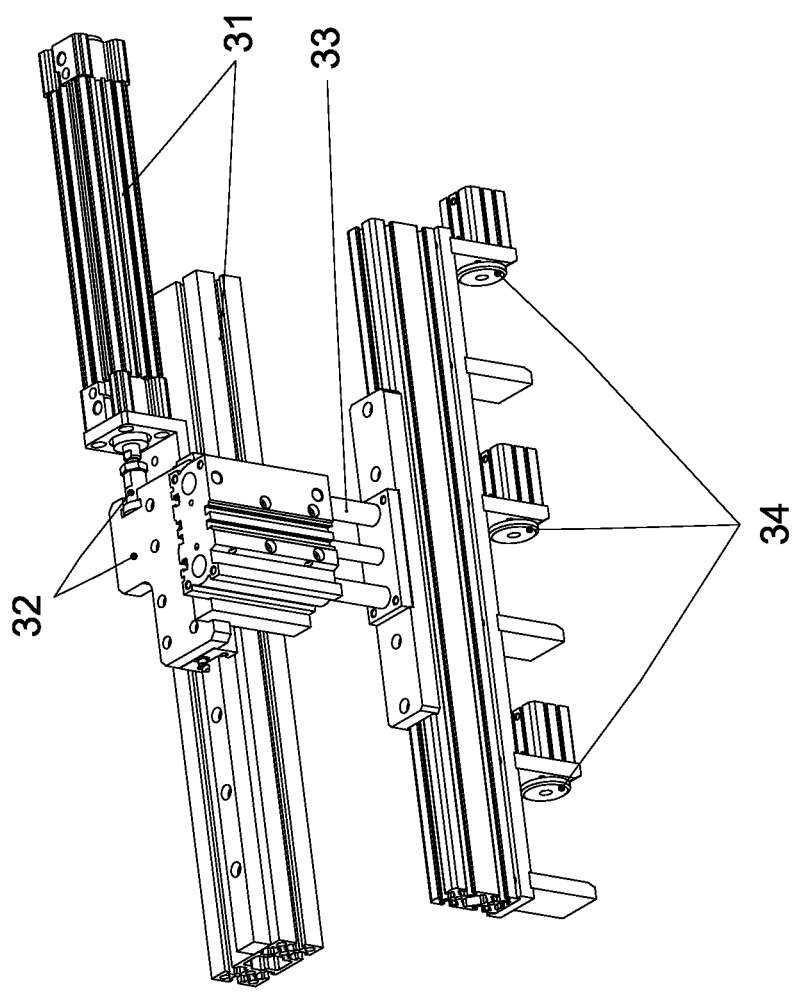
FIG. 3 is a perspective view of a transferring mechanism included in a fabricating unit of an automated testing pipeline for circuit breakers used in the digital-twin modeling method of the present invention, showing it performing hierarchy modeling in Step S2.

For further illustrating the means and functions by which the present invention achieves the certain objectives, the following description, in conjunction with the accompanying drawings and preferred embodiments, is set forth as below to illustrate the implement, structure, features and effects of the subject matter of the present invention.

As shown in FIG. 1, in one embodiment of the present invention, a digital-twin modeling method for an automated testing pipeline for circuit breakers comprises the following steps:

In Step S1, geometric dimensions and geometric shapes of mechanical installations corresponding to testing procedures in the testing pipeline are acquired and three-dimensional modeling is performed, so as to obtain three-dimensional digitalized models of each said mechanical installation in the testing pipeline.

Particularly, the geometric dimension and geometric shape of the mechanical installation(s) corresponding to each testing procedure in the testing pipeline are acquired, and a 1-to-1 scale three-dimensional model of the testing pipeline (or another scale) is built. In this way, three-dimensional digitalized models of all the mechanical installations are built.

In Step S2, according to an actual production process and motion states of the testing pipeline, hierarchy modeling on each said mechanical installation is performed, so as to obtain hierarchically-modeled three-dimensional digitalized models of each said mechanical installation.

Particularly, every part of the geometric models of the testing pipeline is separate. This means that there is no binding or connection between the parts. Mechanical interlocking between the testing installations can be achieved through hierarchy modeling, which involves combining the models of the same mechanical installation that have physical connection and have the same movement tracks into a movement level, or associating the lower level models that have physical connection in terms of movement but have different said movement tracks into children of a higher level model through linkage. For example, some part models may have their central axes offset positionally, so it is necessary to center the central axes of all the digitalized virtual models against the object, so as to minimize errors that may happen during hierarchy modeling due to offset central axes.

In one embodiment, hierarchy modeling is described in detail with reference to the laser marking unit in the automated testing pipeline as an example.

The robot arm rotating mechanism in the laser marking unit is a multi-level model mechanism, as shown in FIG. 2. The models having physical connection and having the same movement track are combined into a movement level. The robot arm rotating mechanism includes four movement levels, namely a robot arm support 21, an extension cylinder 22, a rotation cylinder 23, a left gripping member 24 and a right gripping member 25. The robot arm support 21 is the first-level model; the extension cylinder 22 is the second-level model; the rotation cylinder 23 is the third-level model; and the left and right gripping members 24, 25 form the fourth-level model. The four movement levels are in physical connection but have different movement tracks. The lower level models are then linked into children of a higher level model, thereby achieving interlocking control of the level models.

In another embodiment, hierarchy modeling is described in detail with reference to the fabricating unit in the automated testing pipeline as an example.

In the fabricating unit, the transferring mechanism performs level modeling so as to implement interlocking control of the models, as shown in FIG. 3. The models in the transferring mechanism that have physical connection therebetween and have the same movement track are combined into a movement level. The transferring mechanism comprises four movement levels, namely a transferring support 31, a transverse hydraulic cylinder 32, a vertical hydraulic cylinder 33, and clamping blocks 34. The transferring support 31 is the first-level model; the transverse hydraulic cylinder 32 is the second-level model; the vertical hydraulic cylinder 33 is the third-level model; and the clamping blocks 34 form the fourth-level model. The four movement levels have physical connection therebetween but have different movement tracks. Thus, linkage is used to associate the lower level models into children of a higher level model, thereby establishing movement association.

In Step S3, mesh optimization is performed on the hierarchically-modeled three-dimensional digitalized models of each said mechanical installation.

Particularly, in the hierarchically-modeled three-dimensional digitalized models of each said mechanical installation, every unit has a large number of faces and vertices. Too many faces and vertices can bring about heavy computation workload, leading to delayed system display. Thus, complicated models have to be optimized under the principle of "fewer models, fewer vertices". For this purpose, mesh optimization is performed by reducing the number of polygons, and a specialized optimization modifier is used to quantitatively reduce the vertices and faces of the polygons in the models. Therefore, "performing mesh optimization on the hierarchically-modeled three-dimensional digitalized models of each said mechanical installation" is realized by decreasing vertex numbers and face numbers of polygons included in the hierarchically-modeled three-dimensional digitalized models of each said mechanical installation.

In addition, the optimized collapsed operation can delete the modifier without compromising the optimization, so that the system is freed from running the modifier every time it operates, thereby saving memory occupied by the models.

In one embodiment, the riveting machine in the riveting unit has multiple panels and buttons. The polygons are simplified into an integral face, with buttons and unnecessary faces deleted, thereby achieving mesh optimization. Then the specialized optimization modifier is added to quantitatively decrease the vertices and faces. Also, there are too many polygons in the conveyer model, so the internal polygons are deleted, and the model is capped, thereby processing the entire conveyer model into complete faces and in turn improving the efficiency in executing the model.

In Step S4, according to actual production workflow of the testing pipeline, movements of each said mechanical installation are designed and each mechanical movement track on the mesh-optimized, hierarchically-modeled three-dimensional digitalized models of said mechanical installation is acquired.

Particularly, designing movements for each said mechanical installation requires combination of actual motions corresponding to the actual testing procedures and their cooperative relationship. Therefore, movement design of the digital models has to be based on hierarchical models. In every frame on the timeline, the motions of the model are recorded, and the motions of frames are played continuously, thereby forming a coherent movement. Therein, the movement track frames recorded on the timeline are set as key frames to be used as the basis of the coherent movement. Since the actual mechanical installation has plural, sequent movement track sections in a complete movement, for movement design of a digital model, the chronological order of the plural movement track sections along the timeline has to be ascertained. Each movement track section involves a multi-level model. According to the present invention, the highest level model is selected to record the start and end positions of the level, and the models of the lower levels are regarded as children to move with the higher-level models, thereby showing motions more smoothly without recording the key frames repeatedly.

The detailed steps are, first, dividing motions of each said mechanical installation in the actual production workflow into a plurality of movement track sections; then determining a chronological order of the plural movement track sections of each said mechanical installation; next, according to the chronological order of the plural movement track sections of each said mechanical installation, on the mesh-optimized, hierarchically-modeled three-dimensional digitalized models of each said mechanical installation, determining the highest level model of each said movement track section of each said mechanical installation, and recording the initial position and the end position of the highest level model of each said movement track section of each said mechanical installation; and at last, taking the recorded initial and end positions of the highest level model of each said movement track section of each said mechanical installation as key frames, and combining all the recorded key frames of the same mechanical installation according to the chronological order of the corresponding movement track sections, so as to obtain the mechanical movement tracks on the three-dimensional digitalized models of each said mechanical installation.

Another embodiment of the present invention is described below with reference to the fabricating unit of the automated testing pipeline. The lifting mechanism in the fabricating unit lowers a circuit breaker from the fabricating installation to a conveyer. The lifting mechanism comprises a first-level lifting support and a second-level lifting cylinder. The lifting movement includes two movement track sections, namely cylinder going up and cylinder going down. The "first up, then down" movement sequence of the lifting cylinder has to be confirmed. In the both movement track sections, the lifting cylinder remains the highest level model, so the key frames of the start and end positions of the upward travel of the lifting cylinder and the key frames of the start and end positions of the downward travel of the lifting cylinder have to be confirmed. The first-level lifting support belongs to none of the movement track sections, and thus no key frame about it has to be recorded.

Another embodiment of the present invention is described below with reference to the multi-pole assembly unit of the automated testing pipeline. A long handle robot arm mechanism in the multi-pole assembly unit is configured to assemble long handles of multi-pole circuit breakers. The long handle robot arm mechanism comprises a first-level robot arm support, a second-level transverse hydraulic cylinder, a third-level vertical hydraulic cylinder, a fourth-level rotation cylinder and fifth-level left/right gripping members. The movement of the robot arm mechanism includes 11 movement track sections, namely the transverse hydraulic cylinder moving leftward to the designated position, the rotation cylinder rotating to the proper angle, the vertical hydraulic cylinder going down, the left/right gripping members holding the long handle, the vertical hydraulic cylinder going up, the transverse hydraulic cylinder moving rightward, the vertical hydraulic cylinder going down, the left/right gripping members opening, the vertical hydraulic cylinder going up, the rotation cylinder returning, and the transverse hydraulic cylinder moving to the initial position. In every movement track section, the key frames of the start and end positions of the highest level model are recorded, so as to complete movement design of the robot arm to hold and assemble the long handle.

Step S5, combining actual movement logic and cooperative relationship among the movements of the testing pipeline to edit the mechanical movement tracks on the mesh-optimized, hierarchically-modeled three-dimensional digitalized models of each said mechanical installation;

Particularly, in order to implement motion control of each said mechanical installation motion (as described in the next step, Step S6), motions of every mechanical installation are edited. The complete movement of each said mechanical installation along the testing pipeline is composed of plural movement track sections. On the respective mesh-optimized, hierarchically-modeled three-dimensional digitalized models of each said mechanical installation, the movement tracks participating in circuit breaker movement are captured and then edited into to-be-controlled motion clips, which are later used to control the circuit breaker movement through late-stage scripting. The movement tracks not participating in the circuit breaker movement are also captured and edited into to-be-played motion clips, which are later played during simulation of the automated testing pipeline, thereby forming a complete and smooth movement process.

Another embodiment of the present invention is described below with reference to the multi-pole assembly unit of the automated testing pipeline. In the multi-pole assembly unit, motion editing is performed on the assembly robot arm mechanism, and the movement includes three motion clips, namely the robot arm moving; the robot arm picking up and moving a circuit breaker; and the robot arm dropping the circuit breaker and returning to its initial position. Therein, the robot arm picking up and moving a circuit breaker is a motion clip that participates in the movement of the circuit breaker. Making a circuit breaker move with the robot arm is achieved by means of control according to a script, which is performed by a model motion control module as described below with reference to Step 6.

In Step S6, motion control is performed on the track-edited, mesh-optimized, hierarchically-modeled three-dimensional digitalized models of each said mechanical installation with the movement tracks edited, and then the three-dimensional digitalized model is introduced into a digital-twin scene for motion simulation, thereby realizing virtual movements synchronous with the movements of the testing pipeline.

Particularly, performing motion control on the track-edited, mesh-optimized, hierarchically-modeled three-dimensional digitalized models of each said mechanical installation with the movement tracks edited comprises kinetic control of the models, motion control of the mechanical installations, coordinated control between kinetic movement of the models and movement of the mechanical installations, and coordinated motion control among the plural installations. Therein, (1) The kinetic control provides motion control of circuit breakers in the digital-twin scene, and is realized through collision testing.

Specifically, circuit breakers as the main object in this scene need to have the identical movement behavior in the digital space as in the reality, and their motion control may be achieved using collision testing. Collision testing may be conducted by, for example, setting up a collider. Colliders may be divided by shape, including box colliders, sphere colliders, mesh colliders and terrain colliders, and used to control the relationship between circuit breakers and the surroundings, thereby protecting circuit breakers from breakdown during operation. Collision testing may be used with actual testing to operate the movement of circuit breakers. In particular, a downward gravity force is applied to the circuit breaker while providing the conveyer with a force mimicking the support force to the collider and friction in the direction opposite to the movement, so as to prevent the circuit breaker from falling down due to the gravity, and controlling the kinetic movement of the circuit breakers using friction.

When a circuit breaker is conveyed by the conveyer, a forward force and acceleration are applied so that the circuit breaker is accelerated from standing still to eventually moving in constant velocity. When the circuit breaker is blocked, the force and acceleration applied to the circuit breaker are cut off, so that the circuit breaker stops moving, until the blockage vanishes and the circuit breaker resumes moving under external force.

(2) The motion control of the mechanical installations refers to performing state modeling on each said mechanical installation corresponding to each testing procedure for the circuit breakers. Therein, the state modeling is edited according to the motions.

Figure 4:
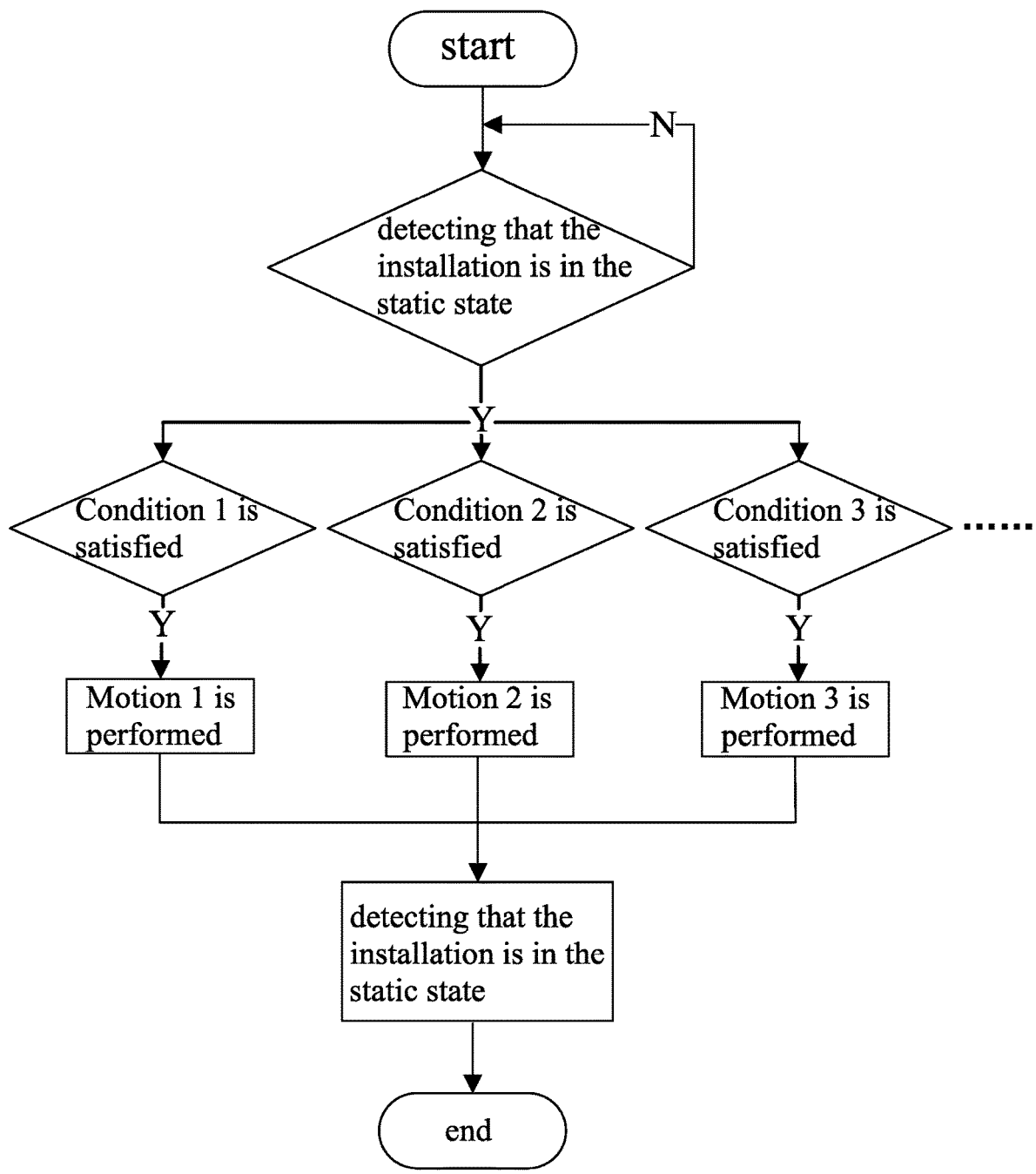
FIG. 4 is a flowchart of motion control of mechanical installations in Step S6 of the digital-twin modeling method of the present invention.

Specifically, the state modeling edited according to the motions comprises installation static state, Motion 1, Motion 2, event conditions triggering the motions and transition between the motions. For a complicated mechanical installation having plural sets of motions, plural trigger conditions have to be set. The mechanical installations keep static during system operation but not performing any motion. For preventing the installations from being triggered during their movements, the trigger conditions are such set that only when the installations are static the trigger events can happen. The movement and logic control of the testing pipeline are relatively complicated. In particular, the trigger conditions for operation states of the installations are numbered successively as Condition 1, Condition 2, Condition 3 and so on, as shown in FIG. 4. When Condition 1 is satisfied, Motion 1 corresponding thereto is performed, until the motion is completed. Then the installation model returns to the static state. Similarly, when other trigger conditions are satisfied, the installation model completes the corresponding movements according to the workflow and executes the motions corresponding thereto, after which the installation model returns to the static state again.

When a circuit breaker is in a certain testing unit and tested, the body of the circuit breaker has to notionally follow the relevant operating mechanisms in this unit. This can be achieved using hierarchy modeling of the body of the circuit breaker and the relevant operating mechanisms. When a circuit breaker is in a certain unit for testing, it is a child of the operating mechanism of the testing unit. When the relevant operating mechanism moves, the circuit breaker moves with it. When the circuit breaker is not being tested, the hierarchical relationship between the circuit breaker and the operating mechanism is terminated.

In addition, for stable system operation, when the circuit breaker moves with the cylinder, the gravity force applied to the circuit breaker is removed, and the circuit breaker is prevented from rotation and displacement.

When the lifting cylinder in the pad printing unit is triggered, it lifts the circuit breaker for pad printing. After the motion is done, the lifting cylinder lowers the circuit breaker. Throughout the period between the lifting cylinder beginning to go up and returning to the lower position, the circuit breaker remains being the child of the lifting cylinder, and moves with the lifting cylinder, so that the mechanical installation lifts the circuit breaker.

The on/off testing mechanism in the on-off withstand voltage unit holds 12 circuit breakers and turn them sideways for testing. When the on/off testing mechanism do turns, the circuit breakers act as children of the mechanism and turn with their parent. After testing, the parent-child relationship between the mechanism and the circuit breaker is terminated and the circuit breakers are returned to the conveyer.

(3) The coordinated control between kinetic movement of the models and movement of the mechanical installations relies on a trigger, which simulates measurement and positioning for the circuit breakers as achieved using sensors in an actual, physical workshop.

Specifically, the trigger represents an alternative way of collision testing. It simulates measurement and positioning for the circuit breakers as achieved using sensors in an actual, physical workshop. The trigger is a collider that has a triggering function and is only for testing but not collision. The data information sent by a testing workshop may include model-driving information and non-model-driving information. The model-driving information is delivered to the digital-twin model of the testing pipeline, for driving the three-dimensional model to move. When a circuit breaker touches the trigger, collision testing is performed on the trigger to determine whether the conditions for execution in the next installation are satisfied. If the trigger conditions are satisfied, the mechanical installation executes the movement motions. If the trigger conditions are not satisfied, the circuit breaker stays in the trigger and the trigger remains running the collision testing in a circular manner, while waiting for all the trigger conditions are satisfied to execute the motions of the installation.

Figure 5:
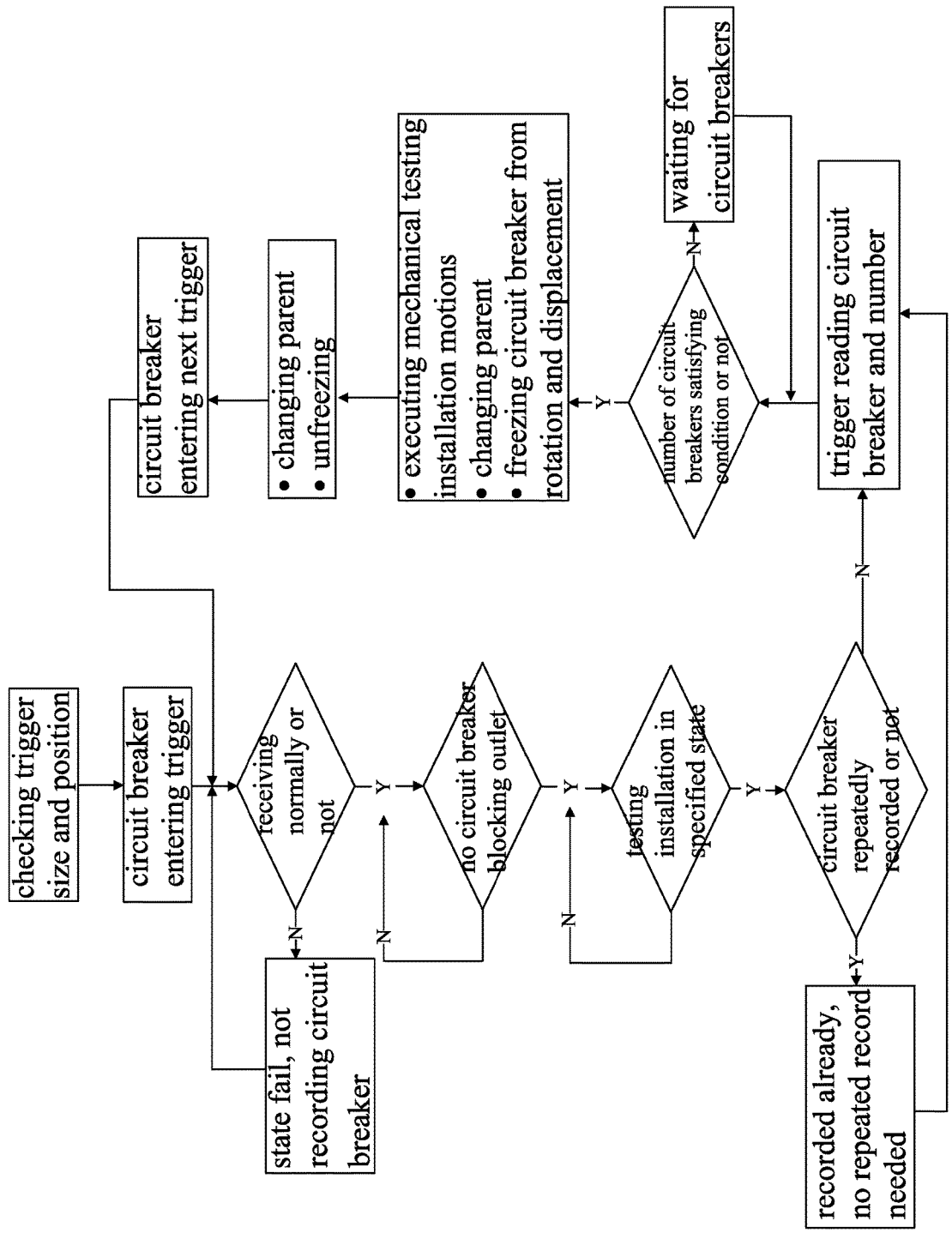
FIG. 5 is a flowchart of coordinated control between kinetic movement of the models and movement of the mechanical installations in Step S6 of the digital-twin modeling method of the present invention.

In the automated testing pipeline, testing procedures are generally about batch testing. Thus, when the trigger starts the collision testing, the first thing to do is to determine whether plural trigger conditions for the mechanical installation to execute its motions are satisfied. These conditions may include the state of the mechanical installation, whether the outlet is blocked by any circuit breaker, whether the mechanical installation is in the specified state, whether repeated recording is done for the circuit breaker, and whether the reset count is reached, as shown in FIG. 5.

In the code-scanning unit, the charging cylinder only moves when a series of trigger conditions are satisfied, including the installation receiving normally; the outlet being free from blockage of circuit breakers; the code-scanning installation being in its static state; and 12 circuit breakers being recorded. Only when all these conditions are satisfied, the motions of the charging cylinder can be triggered. The trigger conditions for the distributing cylinder of the automatic delay unit include: testing showing the installation receiving normally; the outlet being free from blockage of circuit breakers; the distributing cylinder being in its static state; recording fewer than 48 circuit breakers. Only when all these conditions are satisfied, the motions of the distributing cylinder can be executed. Hence, the testing function of the trigger is very important to normal operation of the testing pipeline for circuit breakers.

(4) The coordinated motion control among plural installations is achieved by the plural installations in serial or parallel connection jointly, thereby providing testing of a certain protection characteristic of the circuit breakers.

Figure 6:
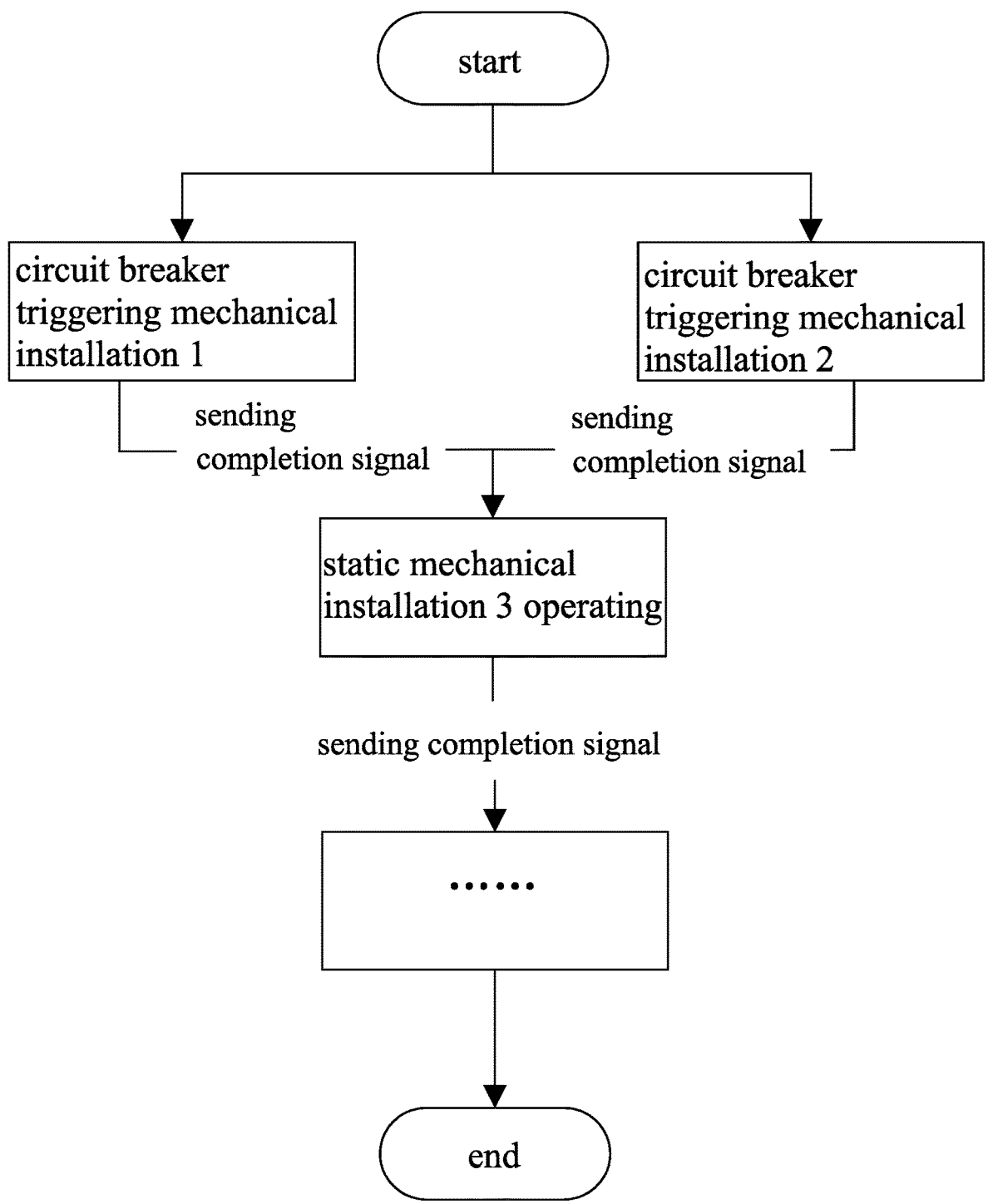
FIG. 6 is a flowchart of coordinated motion control among plural installations in Step S6 of the digital-twin modeling method of the present invention.

Specifically, as shown in FIG. 6, circuit breakers trigger the motions of Mechanical Installation 1 and Mechanical Installation 2. After the two installations complete their movements, they send a motion-completion signal to Mechanical Installation 3. Mechanical Installation 3 receives the signal and only executes the movement motions when it is in its static state, and so forth. Installation 1 and Installation 3 are in serial connection, while Installation 2 and Installation 3 are in serial connection, and they move successively. Installation 1 and Installation 2 are triggered by circuit breakers to move at the same time, and they are in parallel connection.

The turntable mechanism and the charging mechanism in the laser marking unit are in serial connection to execute movement motions successively. After the turntable mechanism drives a circuit breaker to the specified position, the turntable mechanism sends a completion signal to the charging cylinder. At this time, the charging cylinder is in its static state, so it executes charging motions after receiving motion response.

Figure 7:
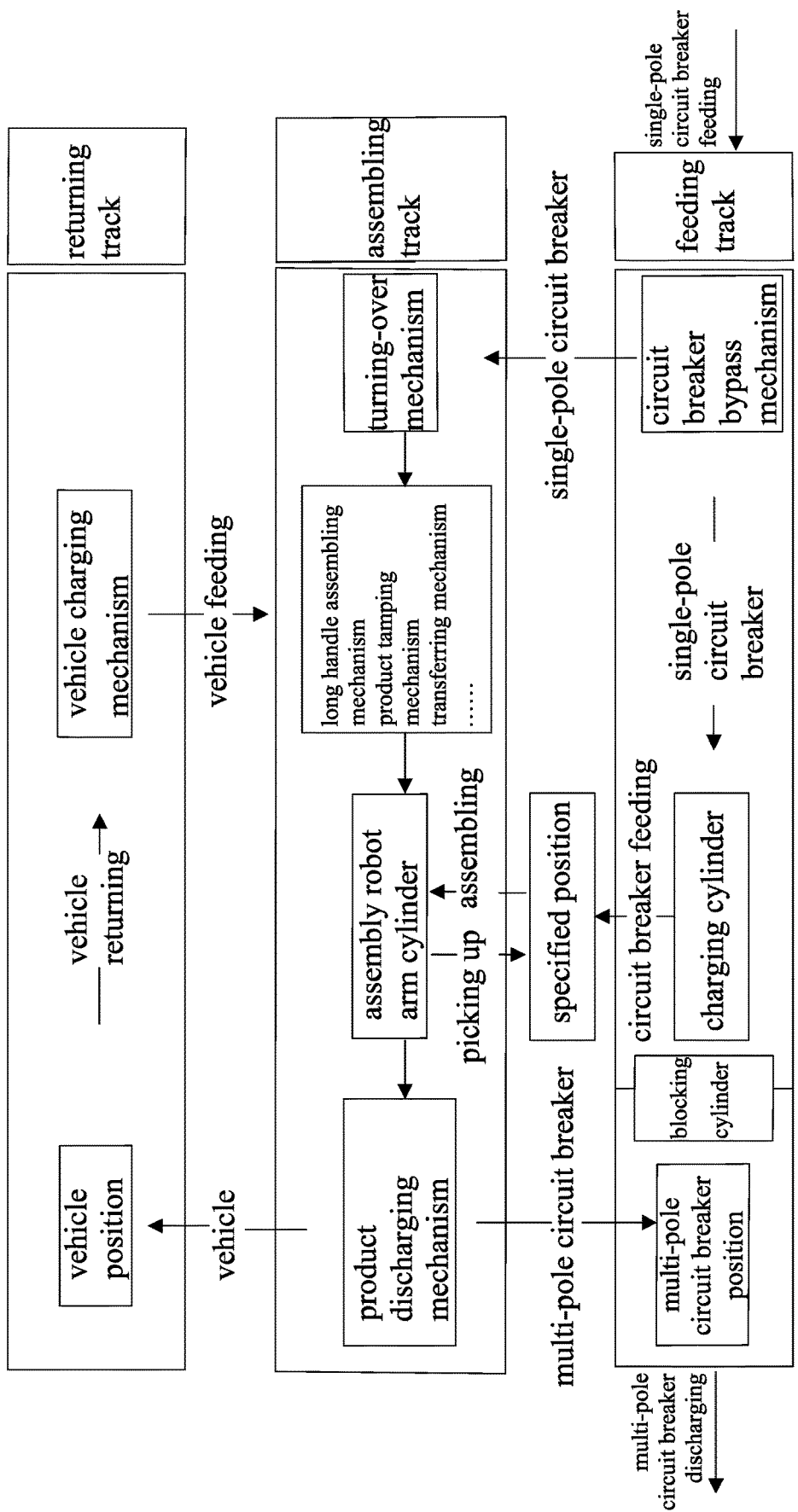
FIG. 7 is a flowchart of coordinated motion control among plural installations for the multi-pole assembly unit according to FIG. 6.

The assembling workflow of the multi-pole assembly unit is as shown in FIG. 7. During operation of the assembly robot arm, the charging cylinder arranged in the feeding track pushes two circuit breakers to specified positions, where they are taken away by the assembly robot arm for subsequent assembling operation. During the assembling operation, the turning-over mechanism in the assembling track stops feeding material. After the assembling work of the multi-pole circuit breaker is completed, the turning-over mechanism keeps waiting, and starts the next cycle of the assembling motions when it detects there are coining circuit breakers to be assembled. The assembly robot arm, the turning-over mechanism and the charging cylinder are three parallelly connected mechanical installations, and they execute their movement motions simultaneously.

Figure 8:
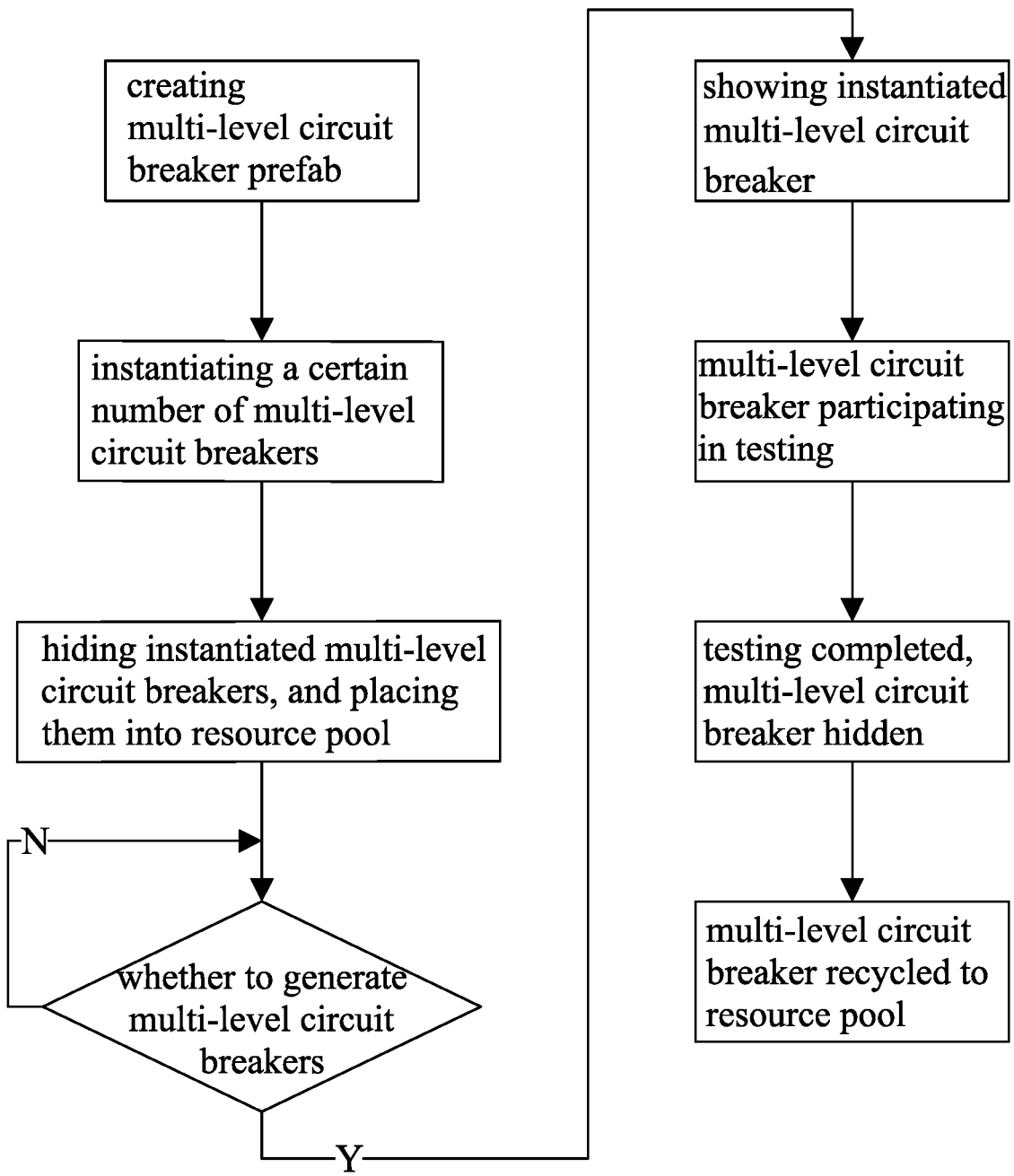
FIG. 8 is a flowchart of coordinated motion control among plural installations for the multi-pole circuit breaker prefab according to FIG. 6.

The multi-pole assembly unit determines whether to conduct multi-pole assembly according to order demands. The multi-pole circuit breakers have the same geometric dimension and geometric shape in the subsequent testing procedures in the testing pipeline, but their positions in the testing pipeline are changed. Therefore, in order to ensure stable operation of multi-pole circuit breakers while minimizing memory consumption, a multi-pole circuit breaker prefab is created and a certain number of instantiation is conducted thereto, as shown in FIG. 8. First, a certain number of circuit breakers are instantiated in the scene and hidden. They are placed into a resource pool. When new multi-pole circuit breakers have to be generated at specific positions, the multi-pole circuit breakers show and participate in the subsequent testing motions. When all the tests are completed, the multi-pole circuit breakers are hidden and recycled into the resource pool for later use. With such reuse, frequent instantiation and resource consumption required by destruction can be reduced.

In the embodiment of the present invention, after the digital-twin model of the automated testing pipeline is created, the scene has to be optimized, so as to enhance the model in terms of realism and stereoscopic depth. In particular, global illumination is used to optimize rendering of the digital-twin scene, and lighting parameters are set to bake the automated testing pipeline scene. Such rendering is helpful to improve lighting effects.

In addition, for more realistic rendering effects, plural light probes are added around each testing installation module to wrap up it, for baking the scene again and providing more intensive and realistic lighting effects. The more the light probes are, the better the rendering is, yet the more the consumption of computational resource is. The use of Static is somehow helpful to improve computational efficiency of rendering. In particular, before the scene is baked, stationary installations are set as static objects, so that they are ignored when the computer performs rendering, thereby enhancing computer rendering efficiency.

By implementing the present invention embodiment, the following beneficial effects can be achieved. The present invention uses physically based data of the automated testing pipeline to create three-dimensional models, and conducts motion control according to actual production workflow of the testing pipeline, thereby fully mapping and expressing actual, physical equipment in terms of geometric dimension, appearance, physical property, dynamic property, and movement logic of the models. With information fusion and interaction among actual, physical installations of the testing pipeline, the present invention realizes centralized management of production data of the pipeline, and realizes remote visualized operation, management and maintenance of the testing pipeline, thereby providing a basic platform for digitalized production of miniature circuit breakers.

People of ordinary skill in the art should appreciate that implementation of all or a part of the steps of the method as described in the foregoing embodiment may be realized using programs to command relevant hardware. The programs may be stored in a computer-readable storage medium, such as a ROM/RAM, a disk, a disc, and so on.

The present invention has been described with reference to the preferred embodiments and it is understood that the embodiments are not intended to limit the scope of the present invention. Moreover, as the contents disclosed herein should be readily understood and can be implemented by a person skilled in the art, all equivalent changes or modifications which do not depart from the concept of the present invention should be encompassed by the appended claims.

What is claimed is:

1. A digital-twin modeling method for an automated testing pipeline for circuit breakers, comprising steps of:
   Step S1, acquiring geometric dimensions and geometric shapes of mechanical installations corresponding to testing procedures in the testing pipeline and performing three-dimensional modeling, so as to obtain three-dimensional digitalized models of each said mechanical installation in the testing pipeline;
   Step S2, according to an actual production process and motion states of the testing pipeline, performing hierarchy modeling on each said mechanical installation, so as to obtain hierarchically-modeled three-dimensional digitalized models of each said mechanical installation;
   Step S3, performing mesh optimization on the hierarchically-modeled three-dimensional digitalized models of each said mechanical installation;
   Step S4, according to actual production workflow of the testing pipeline, designing movements of each said mechanical installation and acquiring each mechanical movement track on the mesh-optimized, hierarchically-modeled three-dimensional digitalized models of each said mechanical installation;
   Step S5, combining actual movement logic and cooperative relationship among the movements of the testing pipeline to edit the mechanical movement tracks on the mesh-optimized, hierarchically-modeled three-dimensional digitalized models of each said mechanical installation; and
   Step S6, performing motion control on the track-edited, mesh-optimized, hierarchically-modeled three-dimensional digitalized models of each said mechanical installation with the movement tracks edited, and further introducing the three-dimensional digitalized models into a digital-twin scene for motion simulation, thereby realizing virtual movements synchronous with the movements of the testing pipeline;
   wherein "according to actual production workflow of the testing pipeline, designing movements of each said mechanical installation and acquiring each mechanical movement track on the mesh-optimized, hierarchically-modeled three-dimensional digitalized models of said mechanical installation" in Step S4 comprises steps of:

dividing motions of each said mechanical installation in the actual production workflow into a plurality of movement track sections;

determining a chronological order of the plural movement track sections of each said mechanical installation;

according to the chronological order of the plural movement track sections of each said mechanical installation, on the mesh-optimized, hierarchically-modeled three-dimensional digitalized models of each said mechanical installation, determining the highest level model of each said movement track section of each said mechanical installation, and recording an initial position and an end position of the highest level model of each said movement track section of each said mechanical installation; and taking the recorded initial and end positions of the highest level model of each said movement track section of each said mechanical installation as key frames, and combining all the recorded key frames of the same mechanical installation according to the chronological order of the corresponding movement track sections, so as to obtain the mechanical movement tracks on the three-dimensional digitalized models of each said mechanical installation.

2. The digital-twin modeling method of claim 1, further comprising:

optimizing rendering of the digital-twin scene using global illumination.

3. The digital-twin modeling method of claim 1, wherein "performing hierarchy modeling on each said mechanical installation" in Step S2 refers to either combining the models of the same mechanical installation that have physical connection and have the same movement tracks into a movement level, or associating the lower level models that have physical connection in terms of movement but have different said movement tracks into children of a higher level model through linkage so as to build movement association between the models.

4. The digital-twin modeling method of claim 1, wherein "performing mesh optimization on the hierarchically-modeled three-dimensional digitalized models of each said mechanical installation" in Step 3 is achieved by decreasing vertex numbers and face numbers of polygons included in the hierarchically-modeled three-dimensional digitalized models of each said mechanical installation.

5. The digital-twin modeling method of claim 1, wherein "editing the mechanical movement tracks on the three-dimensional digitalized models of each said mechanical installation" in Step S5 comprises:

on the respective mesh-optimized, hierarchically-modeled three-dimensional digitalized models of each said mechanical installation, capturing the movement tracks participating in circuit breaker movement and editing them into to-be-controlled motion clips, used to control the circuit breaker movement through late-stage scripting; and capturing the movement tracks not participating in the circuit breaker movement and editing them into to-be-played motion clips, used to be played during late-stage simulation of the automated testing pipeline, thereby forming a complete and smooth movement process.

6. The digital-twin modeling method of claim 1, wherein "performing motion control on the track-edited, mesh-optimized, hierarchically-modeled three-dimensional digitalized models of each said mechanical installation with the movement tracks edited" in Step S6 comprises kinetic control of the models, motion control of the mechanical installations, coordinated control between kinetic movement of the models and movement of the mechanical installations, and coordinated motion control among the plural installations, in which the kinetic control of the models is motion control for the circuit breakers in the digital-twin scene, and realizes motion control of the circuit breakers through collision testing;

the motion control of the mechanical installations refers to performing state modeling on each said mechanical installation corresponding to each testing procedure for the circuit breakers, wherein the state modeling is edited according to the motions;

the coordinated control between kinetic movement of the models and movement of the mechanical installations is performed by a trigger, which simulates measurement and positioning for the circuit breakers as achieved using sensors in an actual, physical workshop; and the coordinated motion control among the plural installations is achieved by the plural installations in serial or parallel connection jointly, thereby providing testing of a certain protection characteristic of the circuit breakers.

* * * * *